United States Patent
Li et al.

(10) Patent No.: US 11,876,620 B1
(45) Date of Patent: Jan. 16, 2024

(54) ERROR CORRECTION FOR DECODING FRAMES

(71) Applicant: Hewlett Packard Enterprise Development LP, Spring, TX (US)

(72) Inventors: Kuanyue Li, Beijing (CN); Jianpo Han, Beijing (CN)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/821,630

(22) Filed: Aug. 23, 2022

(51) Int. Cl.
*H04L 1/00* (2006.01)

(52) U.S. Cl.
CPC .......... *H04L 1/0036* (2013.01); *H04L 1/0009* (2013.01)

(58) Field of Classification Search
CPC ............................ H04L 1/0036; H04L 1/0009
USPC ......................................................... 375/316
See application file for complete search history.

(56) References Cited

U.S. PATENT DOCUMENTS

| | | | |
|---|---|---|---|
| 6,782,497 B2 | 8/2004 | Yue | |
| 2013/0279585 A1* | 10/2013 | Shen | H04N 19/89 375/240.15 |
| 2015/0249835 A1 | 9/2015 | Yie et al. | |
| 2016/0191917 A1* | 6/2016 | Fu | H04N 19/13 375/240.07 |
| 2017/0041959 A1* | 2/2017 | Itagaki | H04W 24/08 |
| 2017/0185474 A1* | 6/2017 | Thoukydides | H04L 67/568 |
| 2020/0329500 A1 | 10/2020 | Newman et al. | |
| 2022/0103208 A1* | 3/2022 | Yu | H04L 69/24 |
| 2022/0329823 A1* | 10/2022 | Chen | H04N 19/105 |

OTHER PUBLICATIONS

Magistretti et al., "802.11ec: Collision Avoidance without Control Messages", Aug. 22-26, 2012, 12 Pages.

* cited by examiner

*Primary Examiner* — Hirdepal Singh
(74) *Attorney, Agent, or Firm* — King & Wood Mallesons

(57) ABSTRACT

Implementations of the present disclosure relate to a method for decoding error correction. The method comprises detecting a failure of decoding a received frame. After the failure of decoding the received frame is detected, a type of the received frame is determined based on a probability that the received frame follows a prior frame of the received frame in a frame sequence. The method further comprises obtaining a template corresponding to the type of the received frame, and decoding the received frame based on the fixed values in the template. The template includes fixed values corresponding to the type of the received frame. With these implementations, correction ability of the decoding can be obviously improved with assistance of the constructed template.

20 Claims, 17 Drawing Sheets

ERROR CORRECTION FOR DECODING FRAMES

BACKGROUND

Wireless communication systems depend on channel coding (sometimes called forward error correction) to ensure that the data received is the same as the data sent. Wireless links suffer from interference and fading which causes errors, and thus the transmitter adds additional information before the data is sent. Then, at the receiver end, for complex codes, sophisticated algorithms are required to decode this information and recover the original data. For example, to reduce the interference of the white noise and the burst noise, binary convolutional code (BCC) or Low density parity check code (LDPC) are used as the forward error correction code in the physic (PHY) layer transmission of the Wireless Fidelity (Wi-Fi) signal. Although, the performance of some coding solutions can meet the requirements of most of the applications, new coding schemes are still being studied to improve the error correction ability of communications.

BRIEF DESCRIPTION OF THE DRAWINGS

Through the following detailed descriptions with reference to the accompanying drawings, the above and other objectives, features and advantages of the example implementations disclosed herein will become more comprehensible. In the drawings, several example implementations disclosed herein will be illustrated in an example and in a non-limiting manner, where.

DETAILED DESCRIPTION

As described above, currently, the coding of data frames in Wi-Fi has already been upgraded from BCC to LDPC. As a result, the error correction ability has been improved to a certain extent. However, traditional coding schemes are designed with regard to the PHY layer and based on the information theory that forward error correction (FEC) can work well only the signal noise ratio (SNR) is higher than a specific threshold (RX sensitivity). Once the SNR is lower than RX sensitivity, the bit error rate (BER) will gets high rapidly. The frames have been treated as random bits and certain information of the frame due to its nature has been disregarded. This information may relate to the certain patterns of the frame sequences for both transmitted frames and received frames in a process of communication interactions between two entities. For example, a Request to Send (RTS) is followed by a Clear to Send (CTS); data frame is followed by ACK and A-MAC Protocol Data Unit (AMPDU) is followed by block ACK, etc. In addition, in these frames, a large number of fields such as a header may have fixed values. However, this information is not PHY layer information and has not been utilized during conventional decoding process.

In the communication interaction, after a communication entity sends a data frame, it may expect to receive an ACK frame. If the communication entity receives the ACK frame but does not identify the received frame as an ACK frame due to transmission interference. The communication may retransmit the data frame. If the frame sequence information has been utilized in decoding, the encoded ACK frame may be successfully decoded and the retransmission of the encoded data frame would be spared.

To address the problem as discussed above, various example implementations of the present disclosure propose a decoding mechanism with assistance of frame sequence information and the nature of some certain type of frame. In the proposed decoding mechanism, from frame interaction sequence, the type of a next possible frame in the sequence can be estimated along with values of some fixed fields such as destination and source addresses. Based on the estimated type of the received frame and fixed values in the estimated type of frame, a corresponding template with fixed values can be generated and be used as a dictionary. If a decoding error is detected, the frame will look up for the known fixed values in the corresponding dictionary and use the known values to decode the received frame again.

With this implementation, some of the error code words occurred by the transmission interference can be corrected by using the template as a dictionary in association with any applied Error-correcting codes (ECC). Therefore, error correction ability of the decoding is obviously improved with assistance of the frame sequence information and the constructed template.

Figure 1:
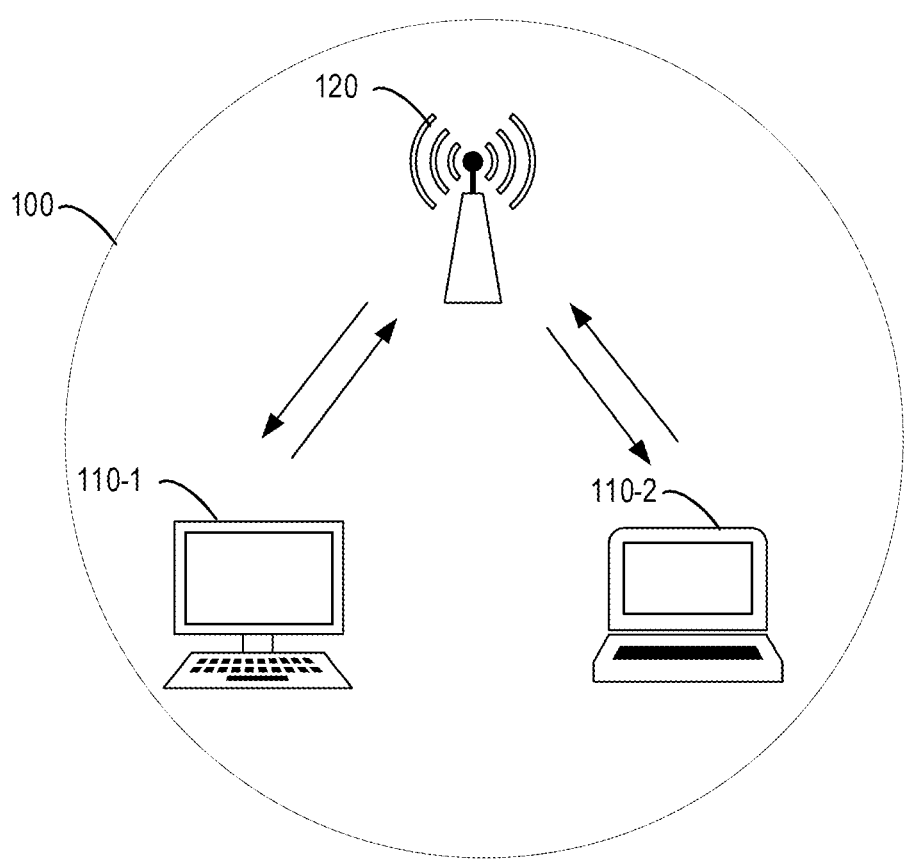
FIG. 1 illustrates a block diagram of an example communication environment in which example implementations of the present disclosure may be implemented.

FIG. 1 illustrates a block diagram of an example communication network 100 in which example implementations of the present disclosure can be implemented. As illustrated in FIG. 1, in the communication network 100, there are a station 110-1 (shown as a personal computer), an access point (AP) 120 and a station 110-2 (shown as a terminal device). The station 110-1 and the station 110-2 are connected to the communication network 100 via the AP 120.

Communications in the example communication network 100 may operate according to the wireless communication protocols such as Institute of Electrical and Electronic Engineers (IEEE) 802.11 standards, Wi-Fi Alliance Specifications, or any other wireless communication standards. The IEEE 802.11 standards may include the IEEE 802.11ay standard (e.g., operating at 60 GHz), the IEEE 802.11ad standard (sometimes referred to as "WiGig"), the IEEE 802.11be (referred to as "Wi-Fi 7") or any other wireless communication standards.

Herein, the term "station" (abbreviated as STA) and "AP" may be directed to devices that have the capability to use the IEEE 802.11 protocols. For example, a station may be terminal devices such as a laptop, a desktop PC, PDA or Wi-Fi phone. An access point AP is a networking device that allows wireless-capable devices to connect to a wired network. Herein, stations and APs are generally referred to as "devices". A station or an AP may also be referred to as a transmitter or receiver based on their transmission characteristics.

Figure 2:
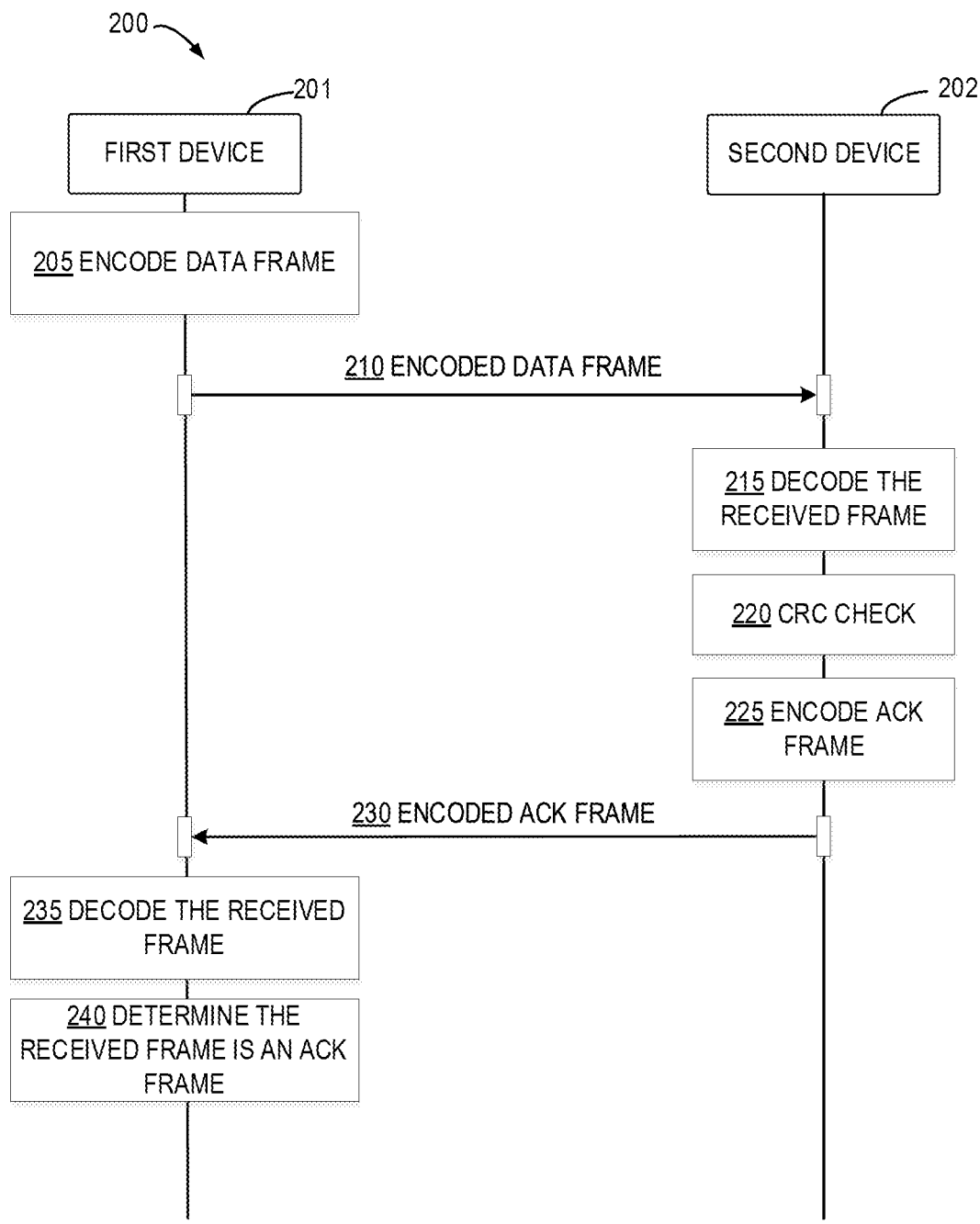
FIG. 2 illustrates a block diagram of an example decoding module in accordance with some example implementations of the present disclosure.

In the communication between two devices in the communication network 100, two devices will act as a transmitter and a receiver in turns. A signal flow between two devices in one communication procedure 200 is illustrated in FIG. 2. The signaling flow 200 involves a first device 201 and a second device 202, where the first device 201 transmits an encoded data frame and the second device 202 responds with an encoded ACK frame. For example, the first device 201 may be corresponding to the station 110-1 and the station 110-2 in the example of FIG. 1, while the second device 202 may be corresponding to the AP 120 in the example of FIG. 1.

As illustrated in FIG. 2, at first, the first device 201 acts as a transmitter and encodes data frames at 205. After the data frame is encoded, the first device 201 transmits the encoded data frame to the second device 202 as the receiver at 210. The second device 202 decodes the received data frame at 215. After the received data frame is decoded, the second device 202 performs cyclic redundancy check (CRC) to validate the received data frame at 220. Once the CRC is successfully performed, which means that the received frame is validated, the second device 202 encodes an ACK frame to inform the first device 201 that the received frame is received at 225. This time, the second device 202 acts as a transmitter and transmits the encoded ACK frame to the first device 201 at 230. Upon receiving the encoded ACK frame, the first device 201 decodes the received frame at 235 and determines the received frame is an ACK frame at 240. To this end, the first device 201 knows that the data frame has been already successfully transmitted.

Hereafter, the decoding mechanism in accordance with some example implementations of the present disclosure will be described in details with reference to FIGS. 3-4D.

Figure 3:
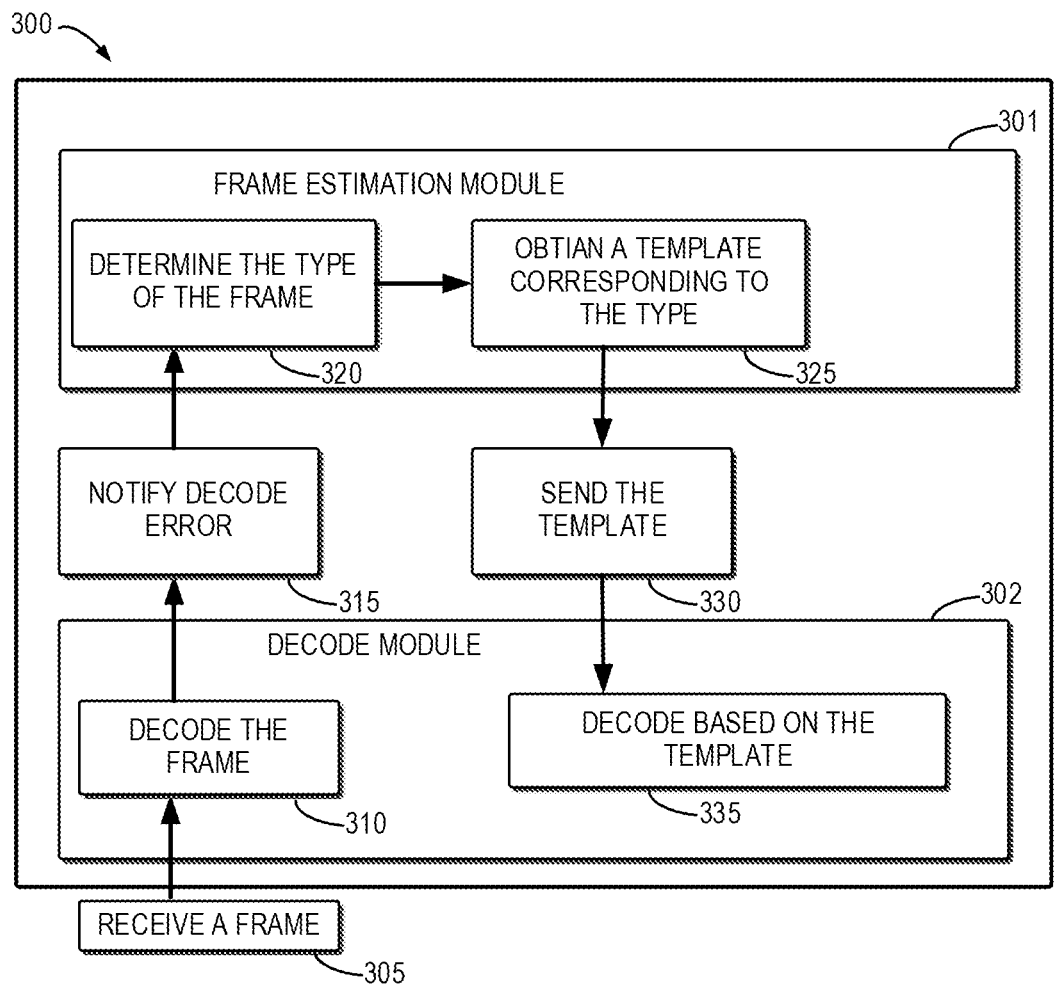
FIG. 3 illustrates a block diagram of an example decoding module in accordance with some example implementations of the present disclosure.

FIG. 3 illustrates a block diagram of an example decoding module 300 in accordance with some example implementations of the present disclosure. As illustrated in FIG. 3, the decoding module 300 comprises a frame estimation module 301 configured to determine the type of the received frame and generate templates corresponding to the type, and a decode module 302 configured to decode received frames. When the decoding module 300 receives a frame at 305, the decode module attempts to decode the received frame at 310. In this implementation, the decode module 302 fails to decode the received frame. In some example implementations, in order to detect the failure of decoding the received frame, the decode module 302 may decode the received frame to obtain a decoded frame. Then, the decode module 302 performs a check on the decoded frame corresponding to an attached check value of the received frame and determines the check value of the decoded frame. If the decode module 302 determines that the check value deviates from the attached check value he decode module 302 will determine that decoding the received frame has failed. For example, the decode module 302 performs a CRC check on the decoded frame. Since the decoded frame is not validated through the CRC check, the decode module 302 determines that the decoding has failed and notifies the frame estimation module about the decode error at 315. After the frame estimation module 301 receives the notification about the decode error, the frame estimation module 301 determines the type of the frame based on a frame sequence and probabilities of the types of frame followed by respective types of frame in the frame sequence at 320.

In some example implementations, the frame estimation module 301 may determine a transmitted frame prior to the received frame in the frame sequence. Then, the frame estimation module 301 obtains a plurality of probabilities associated with the transmitted frame from a probability table. In this case, each term in the probability table indicates a probability that a first type of frame is followed by a second type of frame. It should be noted that the first type can be same as the second type. Thereafter, the frame estimation module 301 selects at least one probability greater than a predefined threshold from the plurality of probabilities. Finally, the frame estimation module 301 determines at least one type of the received frame according to the selected at least one probability, the at least one type comprising the type.

Generally, there are three major types of IEEE 802.11 frames: management, control, and data. Management frames are used to enable stations to establish and maintain communications. Control frames control access to the medium. Data frames contain payloads that are the layers 3-7 information. Specifically, the control frame includes serval subtypes and the header of control frame includes subtype field that may indicate the type of the control frames as below:

TABLE 1

Types of the Control Frames

| Subtype Field | Description |
| --- | --- |
| 0100 | Beamforming Report Poll |
| 0101 | VHT/HE NDP Announcement |
| 0110 | Control Frame Extension |
| 0111 | Control wrapper |
| 1000 | Block ACK Request |
| 1001 | Block ACK |
| 1010 | PS-Poll |
| 1011 | RTS |
| 1100 | CTS |
| 1101 | ACK |

In some example implementations, the probabilities are organized as a probability table. Each data term in the probability table indicates a probability that one type of frame is followed by respective frame in the frame sequence. An example probability table is illustrated as below:

TABLE 2

Table of Probability of a next possible Frame

| Frame N | Frame N + 1 | | | | |
| --- | --- | --- | --- | --- | --- |
| | RTS | CTS | ACK | ... | Data |
| RTS | 5% | 95% | 0.0% | ... | 0.0% |
| CTS | 0.0% | 5% | 0.0% | ... | 95.0% |
| ACK | 10% | 10% | 10% | ... | 10% |
| ... | | | | | |
| Data | 0.0% | 0.0% | 95% | ... | 5.0% | where the Frame N represents the last frame prior to the received frame in the frame sequence and the Frame N+1 represents the possible received frame. Each data term in the probability table indicates the probability that a Frame N is followed by respective Frame N+1. That is, a row of the probability table indicates probabilities that one type of Frame N is followed by all types of Frame N+1.

In some example implementations, in order to obtain the probability table, the frame estimate module 301 may obtain a plurality of frame sequences and determine a statistical probability for each data term in the probability table. It should be appreciated that the "frame sequence" comprises at least one pair of frames, especially consists of a transmitted frame and a received frame. The accuracy of the each statistical probability depends on the number of samples, namely the number of frame pairs in the frame sequences.

In some example implementations, in order to obtain accurate probabilities, the probability table is updated dynamically based on continuously sampled frame sequences. For example, with a priori knowledge, some terms in the probability table may be initialized. Since RTS is followed by CTS with a very high probability and data frames are followed by ACK with a very high probability, the corresponding terms in the probability table can be initialized with 95% while other terms may be initialized to 0 or an evenly-divided value. After initialization, the probability table may be updated by online sampling until the terms in the probability table become stable.

Once the type of the received frame is determined, the frame estimate module 301 obtains a template corresponding to the type of the received frame at 325. In some example implementations, if a corresponding template does not exist, the frame estimate module 301 may generate the corresponding template. Alternatively, the corresponding template may be previously constructed.

In some example implementations, the frame estimate module 301 determines a format corresponding to the type of frame. In this case, the format comprises at least one fixed field. Then, the frame estimate module 301 determines values for the at least one fixed field in the format and applies the values to the fixed fields to generate the template. The format of frames will be described in details with reference to FIGS. 4A-4D below.

The IEEE 802.11 frames include three major parts: header, body, and trailer. The frame header contains information about where the frame is going, the data rate, etc. The four address fields which may be comprised in the frame are source address, destination address, transmitter address, and receiver address. The header contents of different frame type may be different. For example, the header of an ACK frame only uses one of four address fields, namely the receiver address (RA). For a specific type of frame, the header of a frame usually has a fixed pattern and the values thereof are mostly fixed too. The body of an IEEE 802.11 frame contains the layer 3-7 information that is encapsulated and, optionally, protected (encrypted) as well. The body of a frame varies in size depending on the transmission. The body of a frame contains information for other layers and its size is usually random. The trailer contains the frame check sequence (FCS). This may be a 32-bit cyclic redundancy check (CRC) used to validate whether the contents of the entire frame have been tampered with or become corrupted while being transferred over the wireless medium.

As discussed above, there are three major frame types. Data frames are packets of IEEE 802.11, hauling data from station to station. Control frames are used in conjunction with data frames to perform area-clearing operations, channel acquisition and carrier-sensing maintenance functions, and positive acknowledgment of received data. Control and data frames work in conjunction to deliver data reliably from station to station. Management frames perform supervisory functions where they are used to join and leave wireless networks and move associations from access point to access point. Therefore, during communication interactions between devices, most of the frames are control frames and data frames.

Among the three major types of frames, the frame formats of the control frames is special, that is, control frames only contain a header and a trailer, but no body. FIGS. 4A-4D illustrate example frame formats and corresponding templates in accordance with some example implementations of the present disclosure.

Figure 4A:
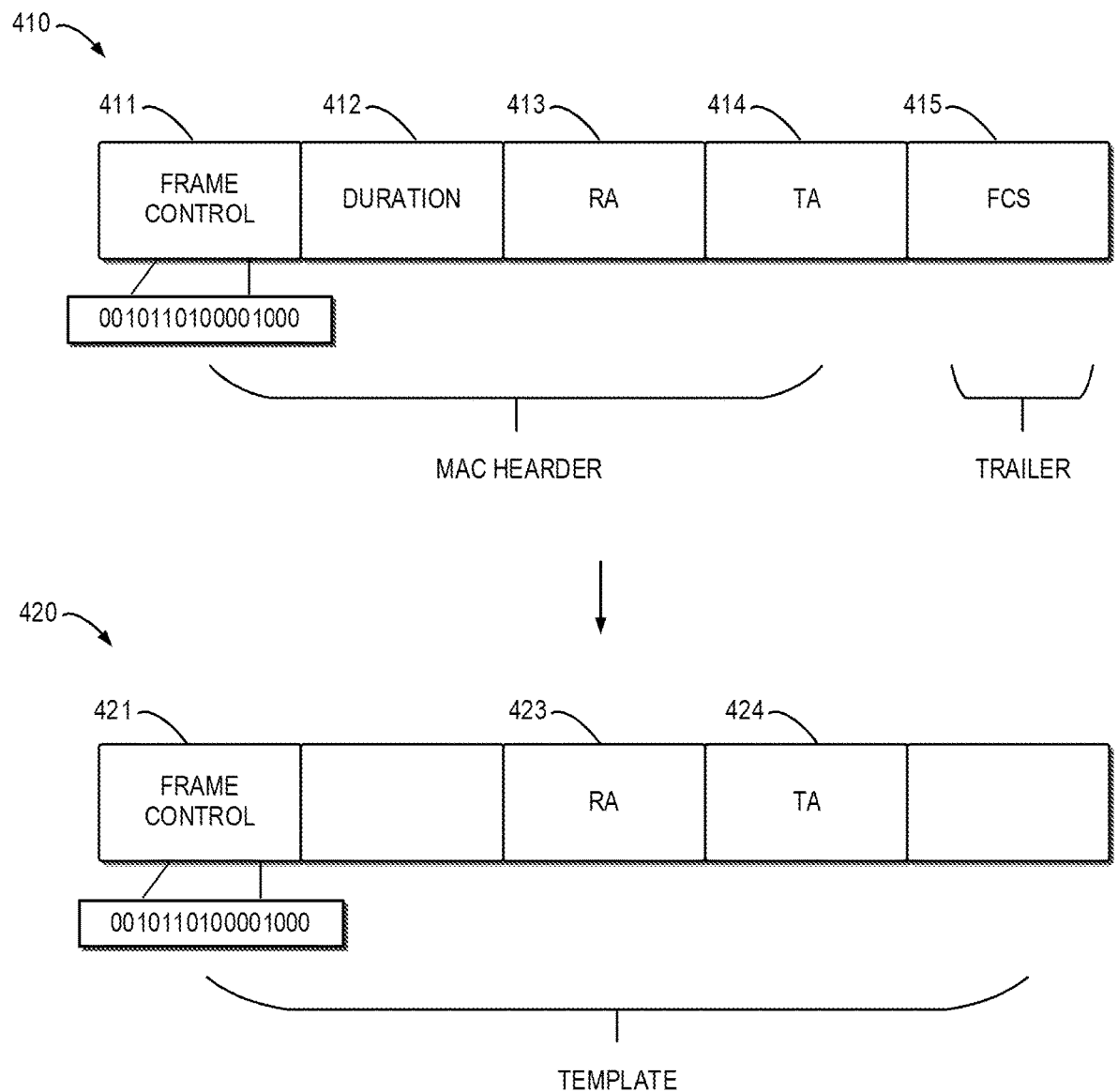
FIGS. 4A-4D illustrate example frame formats in accordance with some example implementations of the present disclosure.

FIG. 4A illustrates a frame format 410 of a RTS frame. Stations send RTS frames to reserve the medium for the amount of time, in microseconds which can be found in the duration field in the frame header. The medium will not be reserved for the station until it receives a CTS frame response from the AP. As illustrated in FIG. 4A, the frame format 410 comprises only two portions, namely a header and a trailer. Further, the header of a RTS frame has four fields, namely Frame control field 411, Duration field 412, receiver address 413 and Transmitter Address field 414 while the trailer comprises a FCS field 415.

Frame Control field 411 contains a frame subtype which is set to 1011 to indicate an RTS frame, but otherwise, it has all the same fields as other control frames. For example, the Frame Control field 411 may be "0010110100001000". It should be noted that the 13th bit of the Frame Control field 411 indicates a state of is set to indicate the power management state of the sender after conclusion of the current frame exchange. This value may vary but it can be determined from other information gathered at the device.

After the Frame Control field 411 is the Duration field 412. The Duration field 412 contains information about the number of microseconds required for the transmission of entire frame exchange which is not fixed.

Next two fields are Receiver Address field 413 and Transmitter Address field 414. Receiver Address field 413 is the address of the station that is the intended recipient of the data frame and Transmitter Address field 414 is the address of the sender of the RTS frame. The values of these two fields can be obtained from prior frames in the frame sequences.

Based on the frame format 410, a RTS template 420 can be determined. The RTS template 420 contains 3 fixed portions, namely a Frame Control field 421 corresponding to the Frame Control field 411, a Receiver Address field 423 corresponding to the Receiver Address field 413 and a Transmitter Address field 424 corresponding to the Transmitter Address field 414 respectively. The other bits in the template will be left empty.

Figure 4B:
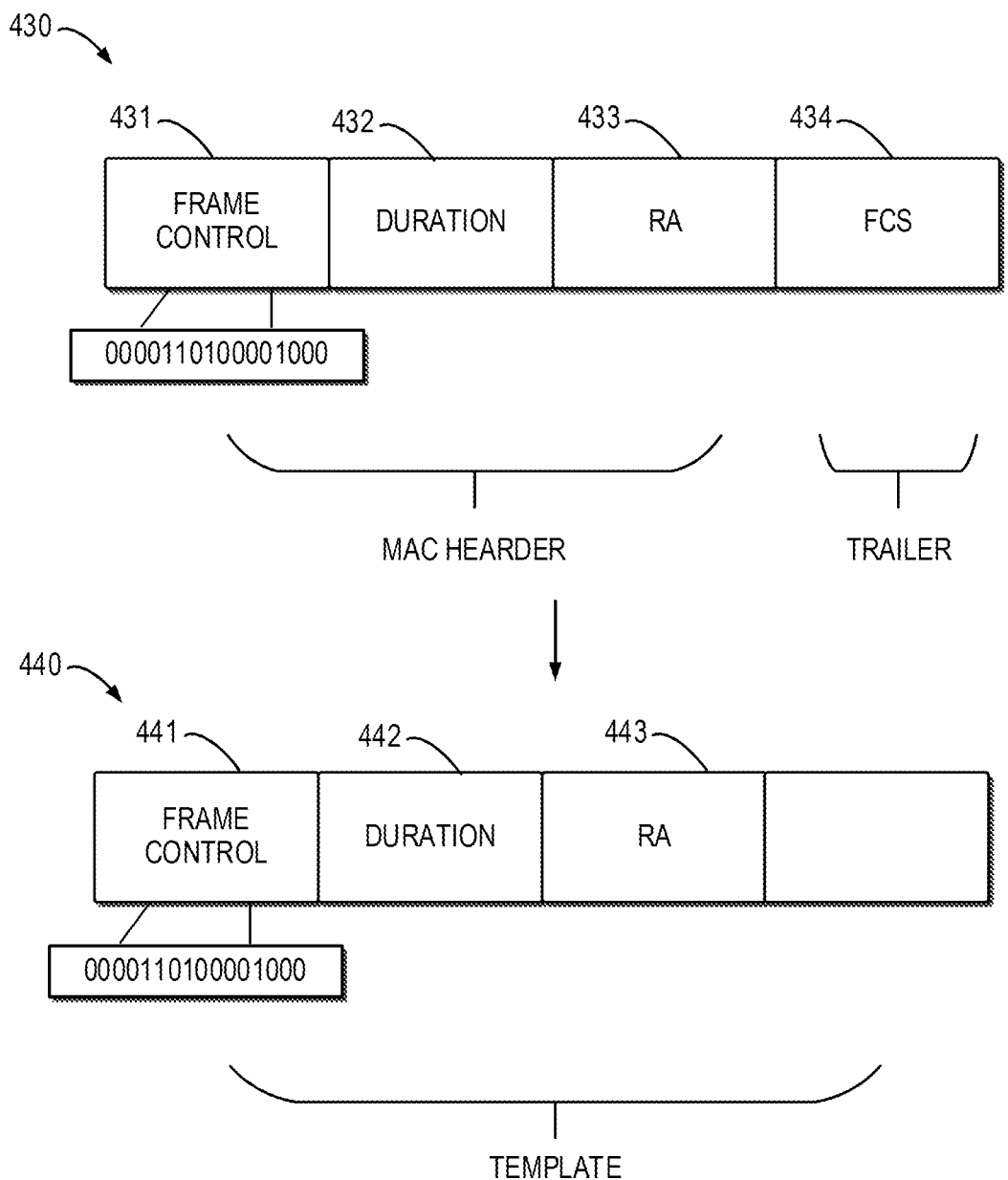

FIG. 4B illustrates a frame format 430 of a Clear to Send (CTS) frame. For example, the CTS frame sent by an AP in response to an RTS frame as illustrated in FIG. 4A sent by the station. CTS messages are sent at the lowest mandatory data rate, allowing them to reach all stations in the BSS. They only use the receiver address (RA) field in the header. The station in the receiver address field is the one that will be transmitting frames. As illustrated in FIG. 4B, the frame format 430 also comprises only two portions, namely a header and a trailer. Further, the header of a CTS frame has three fields, namely a Frame Control field 431, a Duration field 432, and a Receiver Address field 433 while the trailer has FCS field 434.

Similarly, the Frame Control field 431 contains a frame subtype which is set to 0011 to indicate a CTS frame. For example, the Frame Control field 431 may be "0000110100001000".

After the Frame Control field 431 is the Duration field 432. The Duration field 432 is calculated based on the duration from the RTS frame. In this case, since the station that receives a CTS frame is the sender of the RTS frame, the station knows the duration of the RTS frame. Therefore, the Duration field 432 of the CTS frame can be determined and viewed as having fixed values.

Next field is a Receiver Address field 433. The receiver of a CTS frame is the transmitter of the previous RTS frame. Since the previous RTS frame is transmitted from the device, the device knows all in the information contained in the RTS frame. Therefore, the transmitter address of the RTS frame can be copied into the receiver address of the CTS frame. Therefore, values of the Receiver Address field 433 are determined and have fixed values.

Based on the frame format 430, a CTS template 440 can be determined. The CTS template 440 contains 3 fixed portions, namely a Frame Control field 441 corresponding to the Frame Control field 431, a Duration field 442 corresponding to the Duration field 432, and a Receiver Address field 443 corresponding to the Receiver Address field 433 respectively. The other bits in the template will be left empty.

Figure 4C:
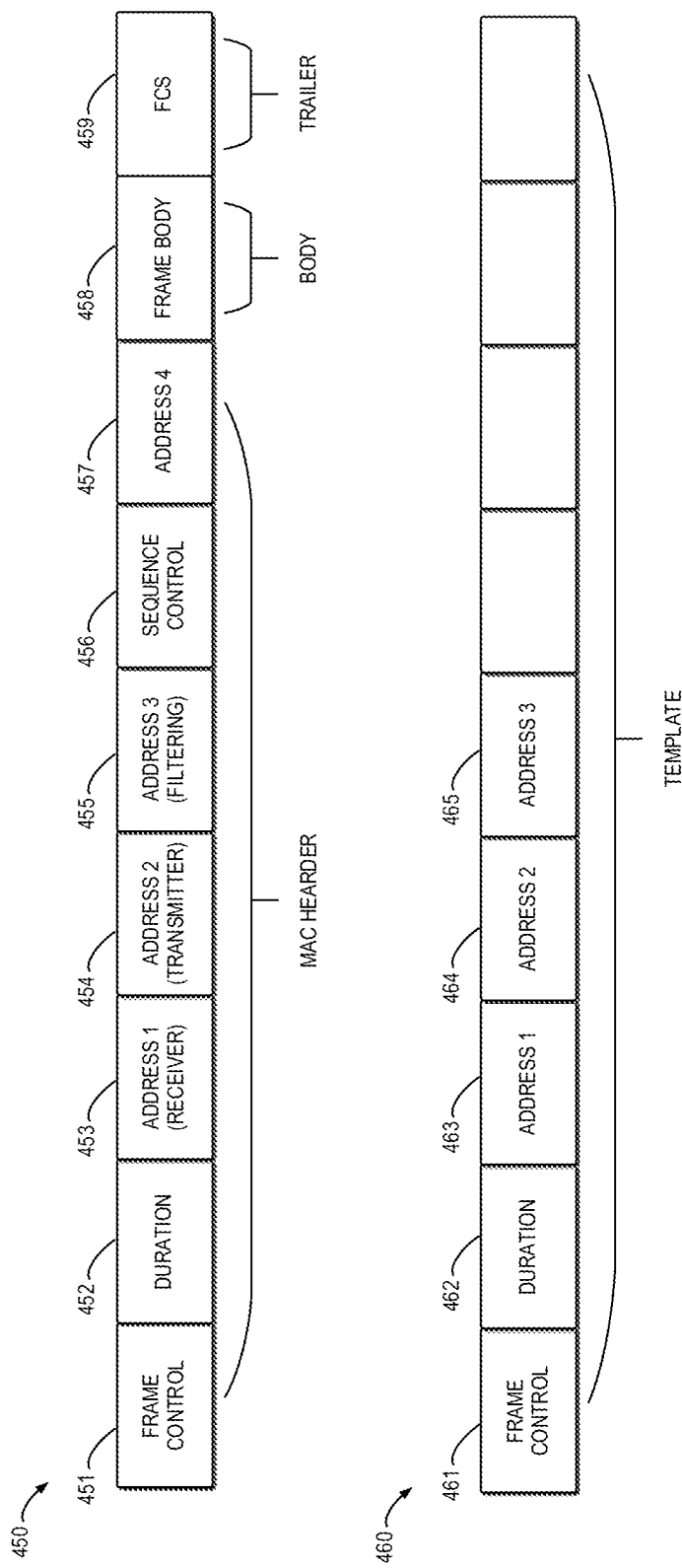

FIG. 4C illustrates a frame format 450 of a data frame. Data frames carry higher-level protocol data in the frame body. The frame format 450 comprises a Frame Control field 451, a Duration field 452, an Address 1 field 453 for the Receiver, Address 2 field 454 for the Transmitter, an Address 3 field 455 for Filtering, a Sequence Control field 456, an optional Address field 457, a Frame body 458 and a FCS field 459.

Although the Frame body 458 is random, some of the fields in the MAC header may be determined from other frames in the frame sequence such as some fields in the Frame Control field 451. The Duration field 452, the Address 1 field 453, Address 2 field 454 and the Address 3 field 455 can be determined from the information comprised in the previous RTS and CTS frames. Therefore, based on the frame format 450, a data frame template 460 can be determined. The data frame template 460 contains 5 fixed portions, namely a Frame Control field 461 corresponding to the Frame Control field 451, a Duration field 462 corresponding to the Duration field 452, and an Address 1 field 463 corresponding to the Address 1 field 453, an Address 2 field 464 corresponding to the Address 2 field 454 and an Address 3 field 465 corresponding to the Address 3 field 455 respectively. The other bits in the template will be left empty.

Figure 4D:
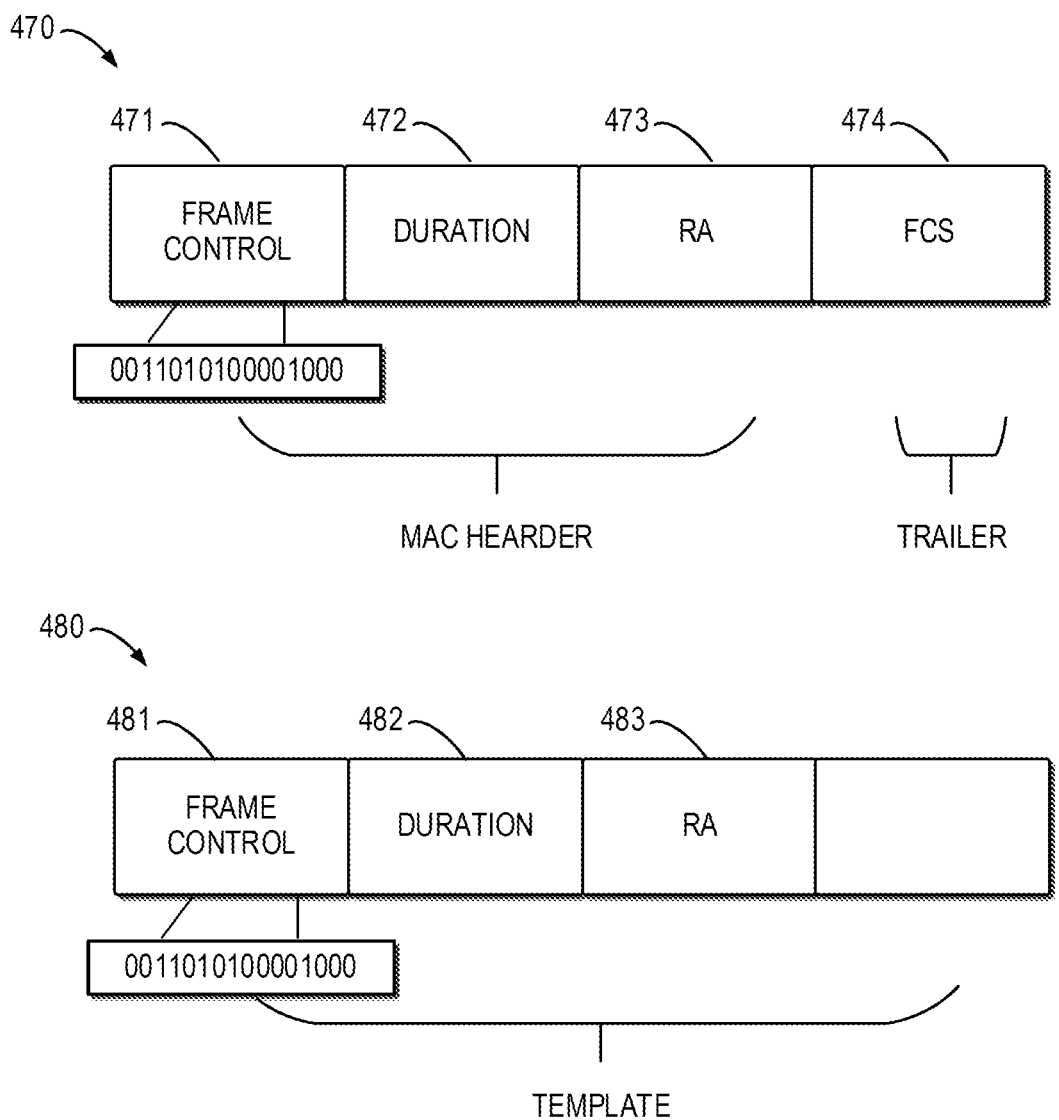

FIG. 4D illustrates a frame format 470 of an Acknowledgement (ACK) frame. ACK frames create a delivery verification method and ACK frames are expected after the transmission of data frames to confirm receipt of the frame. If the CRC check fails, the receiver will not send an ACK frame. If the sender does not receive an ACK, it will retransmit the frame. As illustrated in FIG. 4D, the frame format 470 also comprises only two portions, namely a header and a trailer. Further, the header of an ACK frame has three fields, namely a Frame Control field 471, a Duration field 472, and a Receiver Address field 473 while the trailer has FCS field 474.

Similarly, the Frame Control field 471 contains a frame subtype which is set to 1101 to indicate an ACK frame, but otherwise, it has all the same fields as other control frames. For example, the Frame Control field 471 may be "0011010100001000".

After the Frame Control field 471 is the Duration field 472. The Duration may be set in one of two ways, depending on the position of the ACK within the frame exchange. If the ACK frame is for complete data frames, the duration is set to 0. Otherwise, the duration calculation in non-final ACK frames is similar to the CTS duration calculation. Therefore, the values in the Duration field 472 can be determined.

Next field is a Receiver Address field 473. The Receiver Address field 473 is copied from the transmitter of the frame being acknowledged. Specifically, it is copied from the Address 2 field of the frame being acknowledged, for example the data frame illustrated in FIG. 4C. Therefore, values of the Receiver Address field 473 are determined and have fixed values.

Based on the frame format 470, a data frame template 480 can be determined. The data frame template 480 contains 3 fixed portions, namely a Frame Control field 481 corresponding to the Frame Control field 471, a Duration field 482 corresponding to the Duration field 472, and a Receiver Address field 483 corresponding to the Receiver Address field 473 respectively. The other bits in the template will be left empty.

It should be appreciated that the illustrated formats and corresponding templates are only examples. Other fields of a specific type of frame may be determined from information gathered at the device and the fixed values may be applied in the template.

Back to FIG. 3, when the template corresponding to the received frame is prepared, the frame estimation module 301 sends the template to the decode module 302 at 330. After receives the template, the decode module 302 decodes the received frame based on the fixed values in the template at 335. The encoding and decoding procedure will be described in details with reference to FIGS. 5A-7B.

Figure 6A:
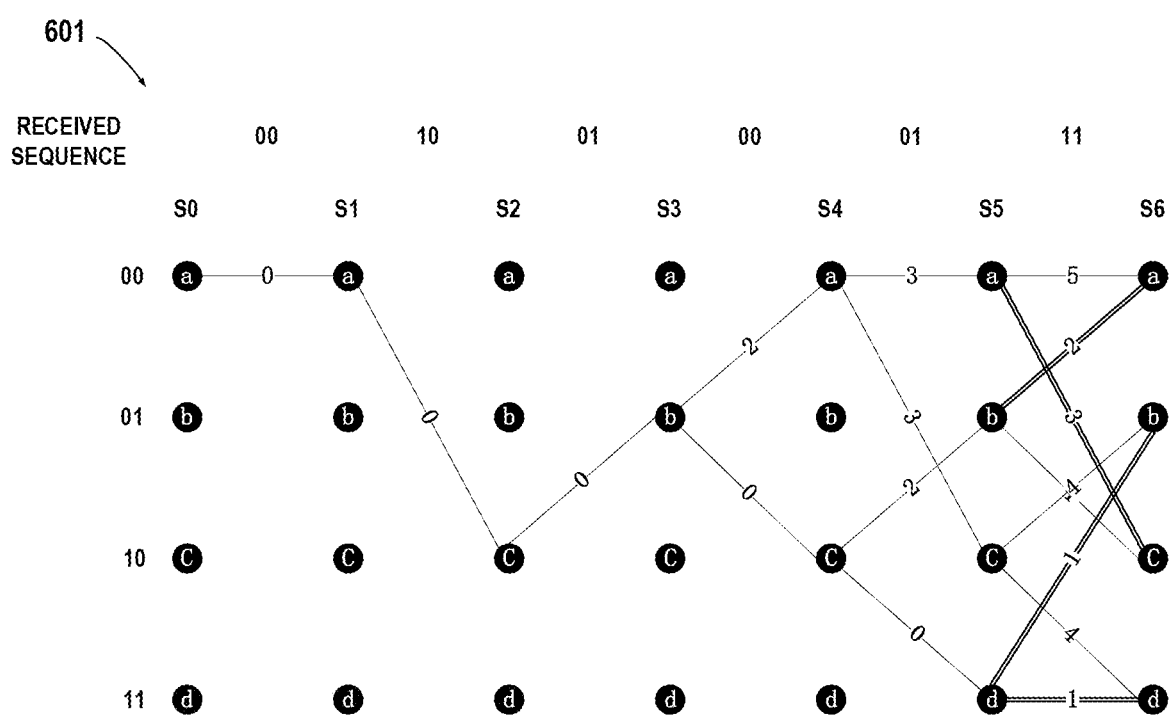
FIGS. 6A-6B illustrate an example decoding procedure in accordance with some example implementations of the present disclosure.
Figure 6B:
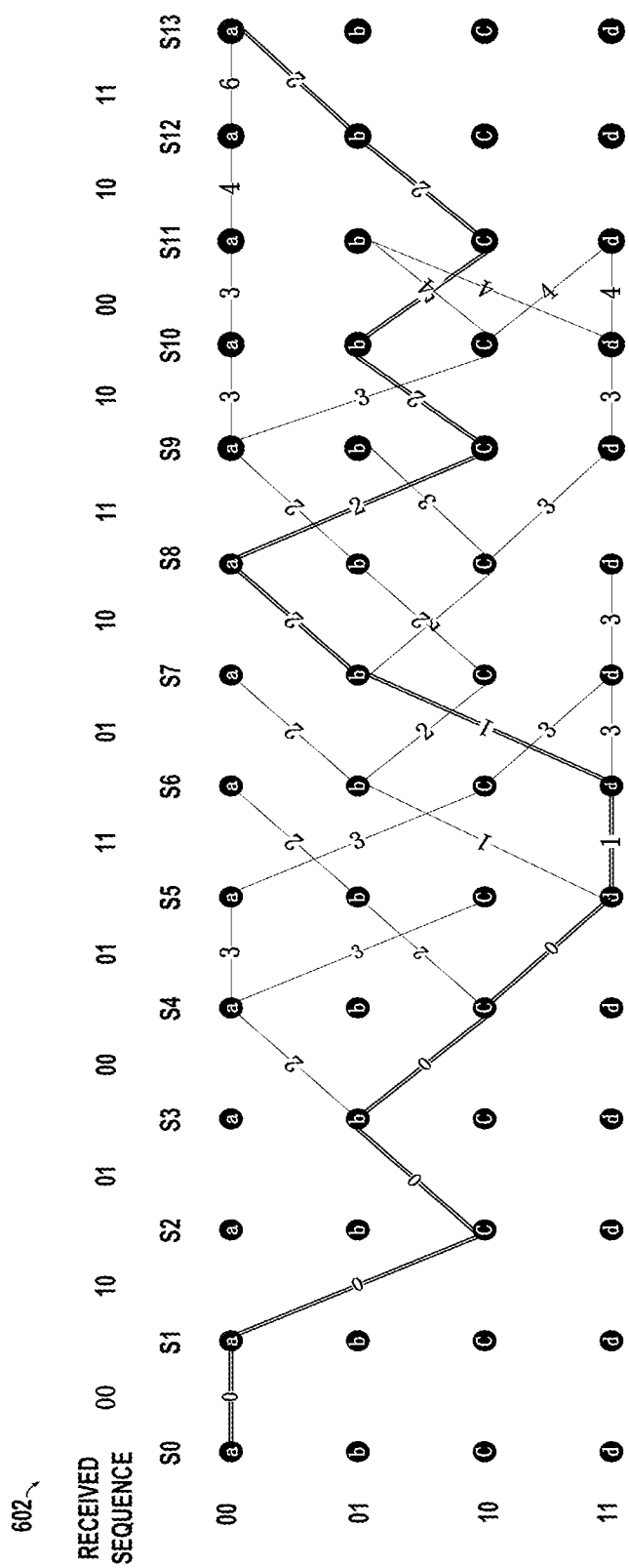
Figure 7A:
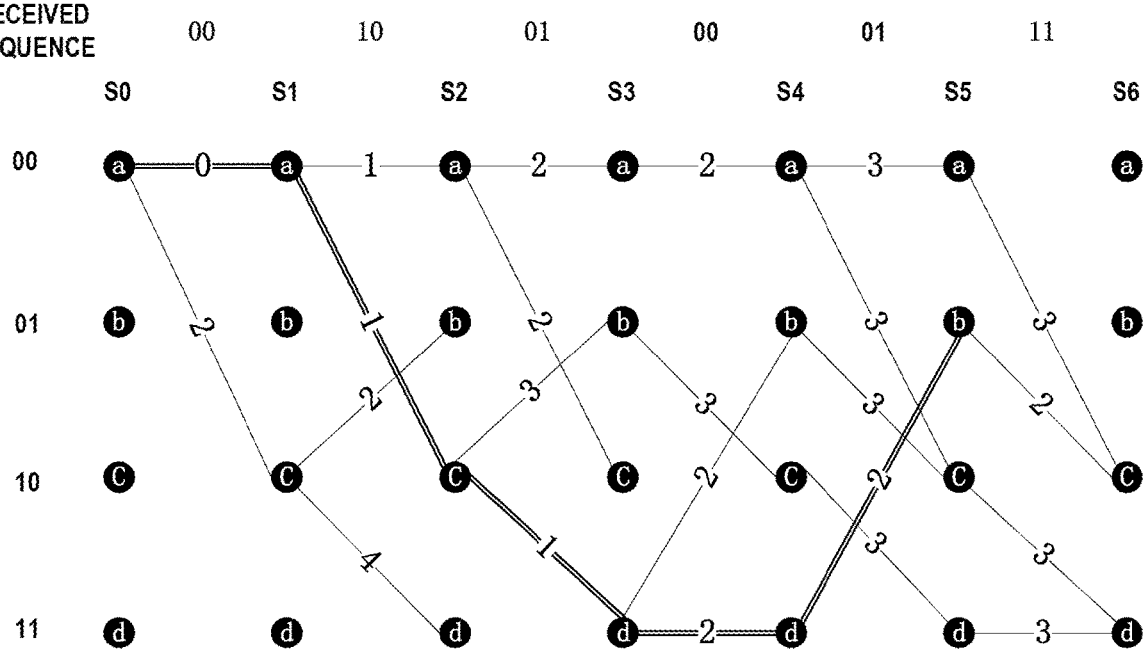
FIGS. 7A-7B illustrate an example decoding procedure in accordance with some alternative example implementations of the present disclosure.
Figure 7B:
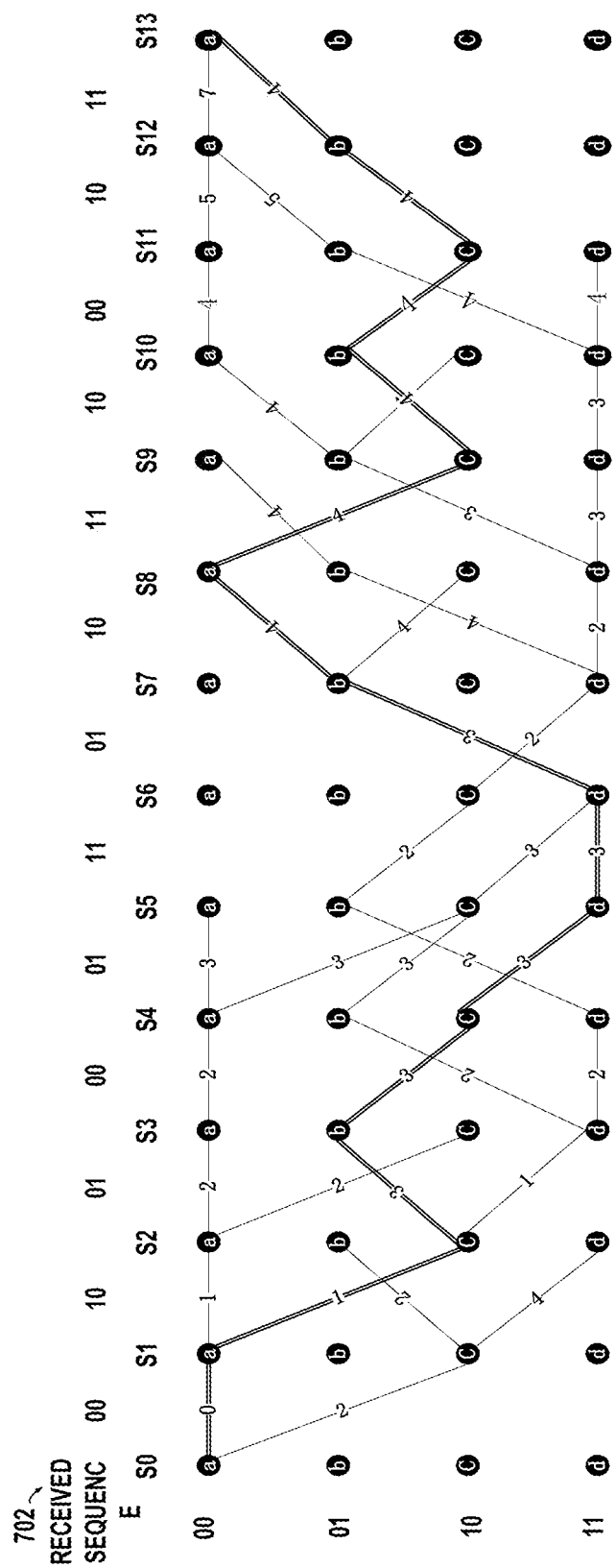

FIGS. 5A-5E illustrate an example encoding and decoding procedure where a failure of decoding occurs. FIGS. 6A-6B illustrate an example decoding procedure in assistance with the template in accordance with some implementations of the present disclosure. FIGS. 7A-7B illustrate an example decoding procedure in assistance with a template in accordance with alternative implementations of the present disclosure.

Generally, errors may occur when frame bits corrupt during transmission over the communication network, due to interference and network problems. In order to overcome these situations, Error-correcting codes (ECC) algorithms have been developed. ECCs are a sequence of code words generated by specific algorithms for detecting and removing errors in data that has been transmitted over noisy channels. ECCs can be broadly categorized into two types, block codes and convolution codes. In the following, the coding procedure is described in the frame of the binary convolutional codes.

Figure 5A:
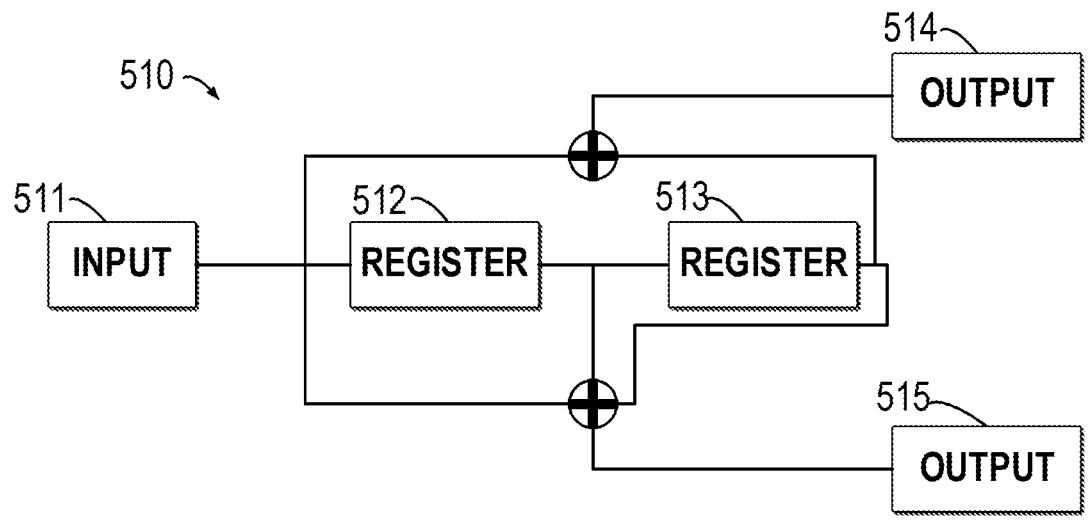
FIGS. 5A-5E illustrate an example encoding and decoding procedure in accordance with some example implementations of the present disclosure.
Figure 5B:
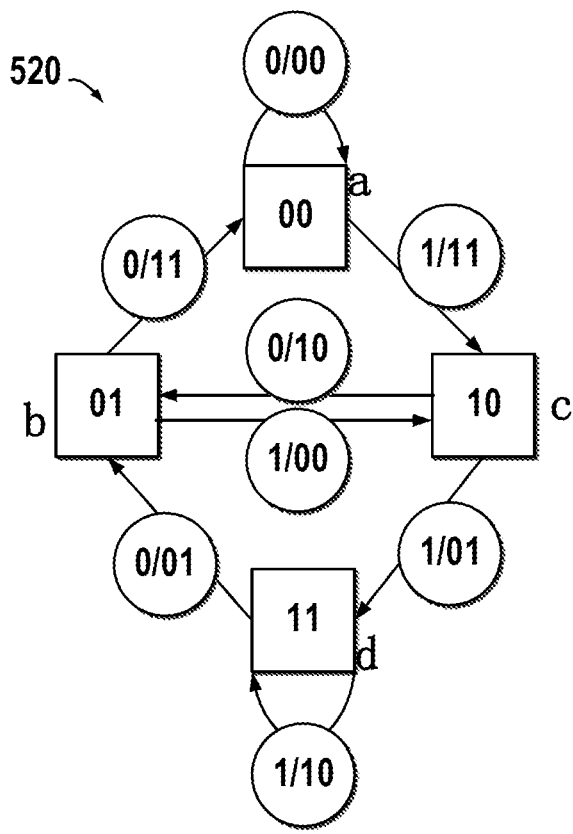

FIG. 5A illustrates an example encoder 510 of a binary convolutional code algorithm. The encoder 510 comprises a register 512 and a register 513. The encoder 510 encodes the entire data stream into a single code word by convolving sequentially. As a result, information is mapped to code bits. For example, during generating a binary convolutional code, the information is passed sequentially through the register 512 and the register 513. The generated binary convolutional code in the illustrated implementation can be specified by three parameters (2, 1, 3), where the parameter "2" represents the number of outputs; the parameter "1" represents the number of the input; and the parameter "3" is referred to as "the constraint length of the convolutional code" which indicates that the encoder has 2 registers. When an input 511 is inputted into the encoder 510, the state of the registers will shift and the encoder 510 will output a first output 514 and a second output 515 to form a 2-bit code word. The relationship between the transition of the state of the registers and the input/output pair can be described with a state diagram 520 as illustrated in FIG. 5B.

For sake of brevity, the states 00, 01, 10, 11 of the registers are later referred to as states "a", "b", "c", "d" respectively. As illustrated in FIG. 5B, the state diagram 520 comprises elements such as squares, circles and lines with arrow where squares represent the states of the registers; circles represent the input/output pair; and the lines with arrow represent the transition between states. For example, when "0" is inputted into the encoder 510, the encoder 510 shifts from state "a" to state "a" and output code word "00". When "1" is inputted is inputted into the encoder 510, the encoder 510 shifts from state "a" to state "c" and output code word "11". Since the diagram is very clear, further descriptions will be omitted here.

Figure 5C:
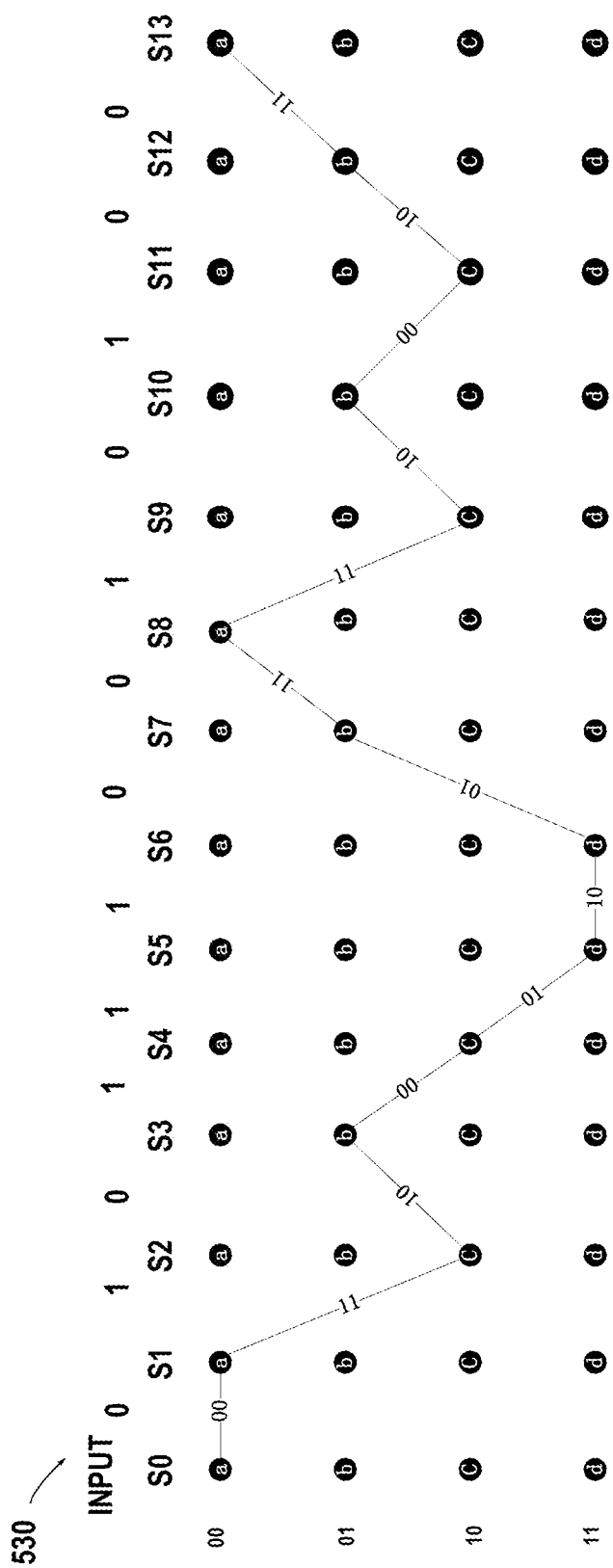

Besides the state diagram, a trellis diagram is also utilized to encode and decode the binary convolutional codes. The trellis diagram is an extension of state diagram which explicitly shows the passage of time. In the trellis diagram, all the possible states are shown for each instant of time. For example, in FIG. 5C, an example trellis diagram 530 for an example encoding procedure of an example data stream is illustrated. As illustrated in FIG. 5C, the trellis diagram 530 includes a 14 instants of time, namely S0, S1, . . . , S13. The extension of time is indicated by a movement to the right. Under every instant of time, there are four states corresponding to the states of the encoder 510 as illustrated in the state diagram 520. The input data bits and output code bits are represented by a unique path through the trellis. For example, the input data bits are "01011100101". Two bonus inputs "00" are added to the end of the input data bits to facilitate a back trace in the decoding procedure. Therefore, the total input data bits are "0101110010100".

In the stage of encoding, the path always starts from state "a". Therefore, the encoding path starts from the state "a" at instant of time S0. According to the state diagram 520, for an input "0", the state transits from state "a" to state "a" and output code word "00". Therefore, the path travels from the state "a" at S0 to the state "a" at S1. The number on the line indicates the output. Analogously, an encoding path can be determined based on the state diagram 520 and a corresponding output code word sequence, i.e., the encoded frame "00 11 10 00 01 10 01 11 11 10 00 10 11" is obtained. Then, the encoded frame will be transmitted to a receiver for communication.

When the receiver receives the encoded frame, the receiver will decode the received frame to obtain the information carried by the frame. However, due to some interference in the channel, serval symbols in the encoded frame may distort and the frame received by the receiver is "00 10 01 00 01 11 01 10 11 10 00 10 11". In practice, various algorithms are developed for decoding binary convolutional code. One of these algorithms is an algorithm for maximum likelihood decoding scheme called Viterbi scheme. In the Viterbi algorithm, for a given received code word, the most likely path through the trellis will be determined. The inputs corresponding to the path will be determined as the bits of the original frame. The decoding procedure in the frame of the traditional Viterbi algorithm will be described with reference to FIGS. 5D-5E.

Figure 5D:
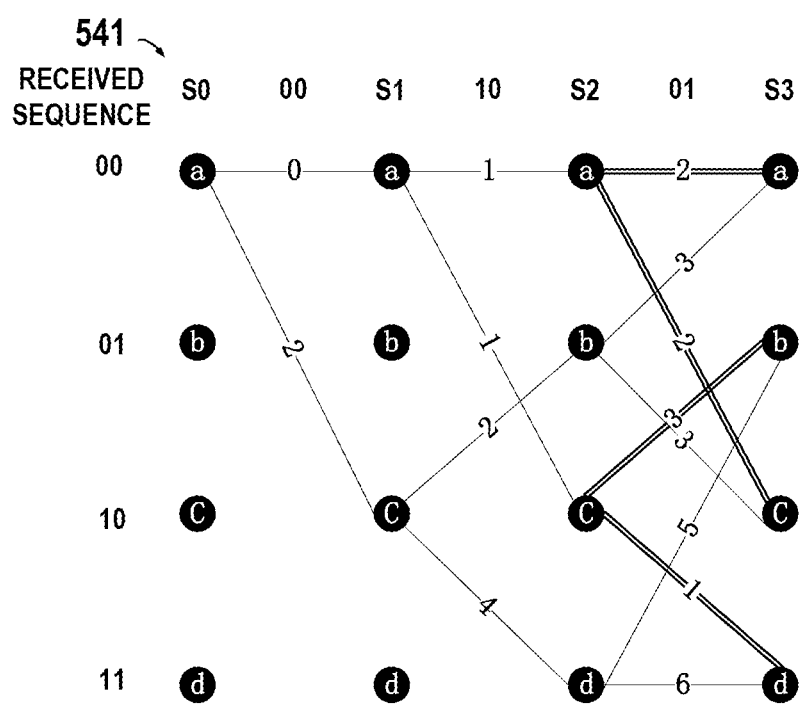

FIG. 5D illustrates a partial decoding procedure 541. In FIG. 5D, at S0, there are two possible paths corresponding to input "0" and input "1" respectively. Every possible path will lead to a corresponding state at S1 and generate a corresponding output. A Hamming distance between the output and the received code word accumulated over the entire path is annotated on every path. As the time extents, the purpose is to find a path with the lowest accumulative Hamming distance. At S3, each state is arrived at by two paths. Therefore, a path selection must be performed. That is, the path with a higher Hamming distance will be discarded. In FIG. 5D, for state "a", the Hamming distance of the path "acba" is higher than that of the path "aaaa". Therefore, the path "acba" is discarded. Analogously, for states "b", "c" and "d", the paths "acdb", "acdc" and "acdd" are also discarded. The survived paths are illustrated in double lines.

Figure 5E:
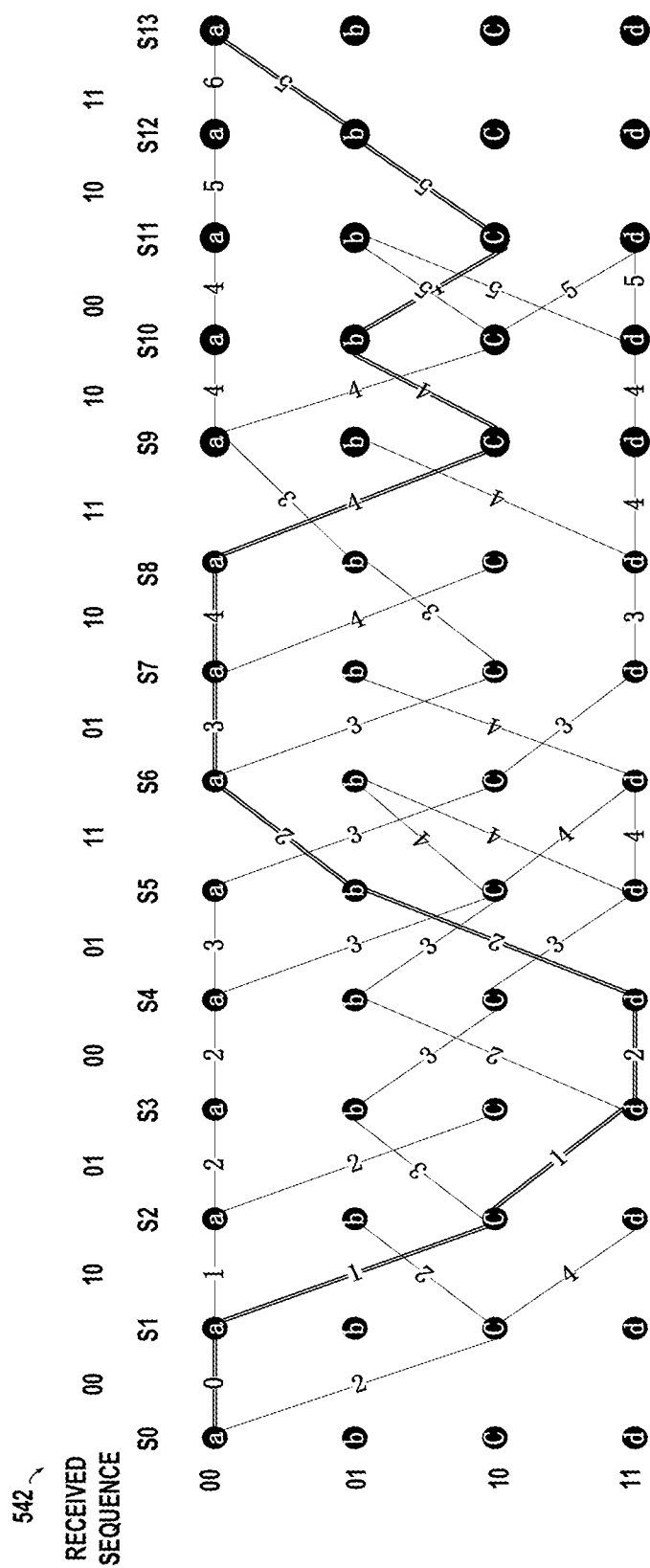

The entire decoding procedure 542 is illustrated in FIG. 5E. Continuous with the Viterbi algorithm and knowing that the last two bits are "0", a decoded frame "0111000010100" is obtained. In comparison to the original input "0101110010100", 3 bits of the decoded frame are wrong which may lead to a failure of the CRC. In accordance with the embodiments of the present disclosure, a template corresponding to the received frame is obtained to facilitate the decoding procedure. The decoding procedure in assistance with the template will be described in details with reference to FIGS. 6A-6B.

For example, according to the template, the first 3 bits of the original frame is "010" which may correspond to the case where the fixed values in the header can be determined. Since these fixed values are located in the first serval bits of the frame, they can be encoded to binary convolutional codes and replace the received code words. FIG. 6A illustrates a partial decoding procedure 601 with assistance of a template. In FIG. 6A, the first 6 bits of the code word is replaced by "00 11 10" and the selection starts at S6 which is later than that in FIG. 5D. Due to the fixed path at the first three nodes, the number of path selections is reduced. The entire decoding procedure 602 is illustrated in FIG. 6B. As illustrated in FIG. 6B, by performing the entire decoding procedure, a decoded frame "0101110010100" is obtained which is the same as the original input. Therefore, by performing decoding in assistance with a template in accordance with the present disclosure, a significant amount of the wrong bits can be corrected.

However, some of the fixed values are not in a continuous sequence with the first bits. In these cases, other approaches may be used during the decoding procedure which is described in details with reference to FIGS. 7A-7B. This may correspond to a general case where some bit in the middle of the received frame is known.

For example, according to the template, the sixth bit of the original frame is "1" which may correspond to the case where the fixed values in the header can be determined. FIG. 7A illustrates a partial decoding procedure 701. In this implementation, when the paths extend to the time instant corresponding to the sixth bit of the received frame, i.e. the time instant S5 in FIG. 7A, the paths only extend in the direction corresponding to a input of "1", namely the paths "ac", "bc", "cd" and "dd". Since the value is fixed, the hamming distance of paths from S5 to S6 will all be set to "0". Due to the fixed value at instant S5, the number of path selections is reduced. The entire decoding procedure 702 is illustrated in FIG. 7B. As illustrated in FIG. 7B, by performing the entire decoding procedure, a decoded frame "0101110010100" is obtained which is the same as the original input. Therefore, by performing decoding in assistance with a template in accordance with the present disclosure, all the wrong bits are corrected by one fixed value in the template.

Figure 8:
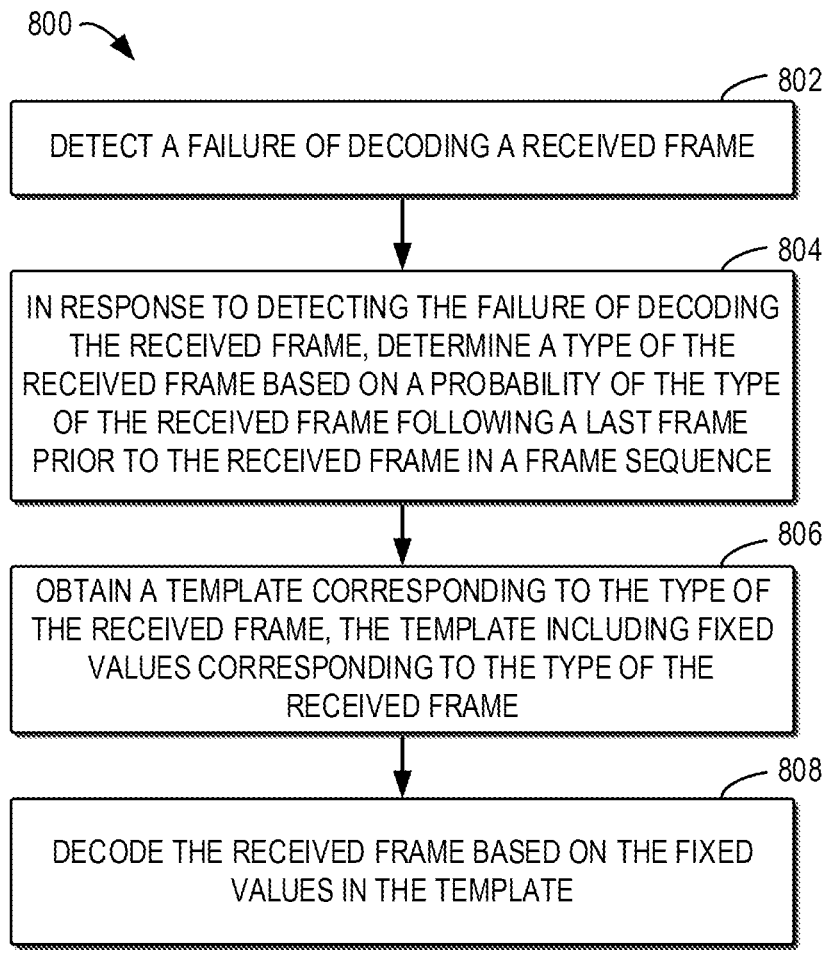
FIG. 8 illustrates a flowchart of a method in accordance with some example implementations of the present disclosure.

FIG. 8 illustrates a flowchart of a method 800 in accordance with some example implementations of the present disclosure. The method 800 can be carried out by the station 110-1, the station 110-2 and the AP 120 (collectively referred to as device) according to the implementations described herein. While only some blocks are shown in the method 800, the method 800 may comprise other operations described herein.

At 802, the device detects a failure of decoding a received frame. At 804, the device determines type of the received frame based on a probability that the received frame follows a prior frame of the received frame in a frame sequence. At 806, the device obtains a template corresponding to the type of the received frame. In this case, the template includes fixed values corresponding to the type of the received frame. At 808, the device decodes the received frame based on the fixed values in the template.

In some implementations, in determining the type of the received frame, the device may determine a transmitted frame prior to the received frame in the frame sequence. The device obtains a plurality of probabilities associated with the transmitted frame from a probability table. In this case, each term in the probability table indicates a probability that a first type of frame is followed by a second type of frame. The device selects at least one probability greater than a predefined threshold from the plurality of probabilities. Then, the device determines at least one type of the received frame according to the selected at least one probability. In this case, the at least one type comprises the type.

In some implementations, the device may obtain a plurality of frame sequences. The device determines a statistical probability for each term in the probability table based on the plurality of frame sequences. Then, the device generates a probability table based on the determined statistical probability.

In some implementations, in decoding the received frame, the device may decode the received frame based on fixed values in the at least one candidate template corresponding to the at least one type respectively to obtain at least one candidate decoded frame. The device determines at least one Bit Error Ratio (BER) for the at least one candidate decoded frame. Then, the device selects a decoded frame with the lowest BER from the at least one candidate decoded frame.

In some implementations, in decoding the received frame based on the fixed values in the at least one candidate template, the device may obtain the fixed values in each of the at least one candidate template. The device encodes the fixed values to obtain fixed code words corresponding to each of the at least one candidate template. The device updates corresponding code words encoded for the received frame with the fixed code words corresponding to each of the at least one candidate template to obtain respective updated code words. Then, the device obtains at least one candidate decoded frame based on the respective updated code words.

In some implementations, the device may further determine a format corresponding to one type of frame. In this case, the format comprises at least one fixed field. The device determines values for the at least one fixed field in the format. Then, the device applies the values to the fixed fields to generate the template.

In some implementations, in determining values for the fixed fields in the format, if the device determines that the format comprises fields corresponding to fields in a known frame, the device may determine the fields in the format as the fixed fields. Then, the device determines values for the fixed fields in the format based on the corresponding fields in the known frame.

In some implementations, in detecting the failure of decoding the received frame, the device may decode the received frame to obtain a decoded frame. The device determines a check value of the decoded frame by performing a check on the decoded frame. Then, if the device determines that the check value deviates from an attached check value of the received frame, the device determines the failure of decoding the received frame.

Figure 9:
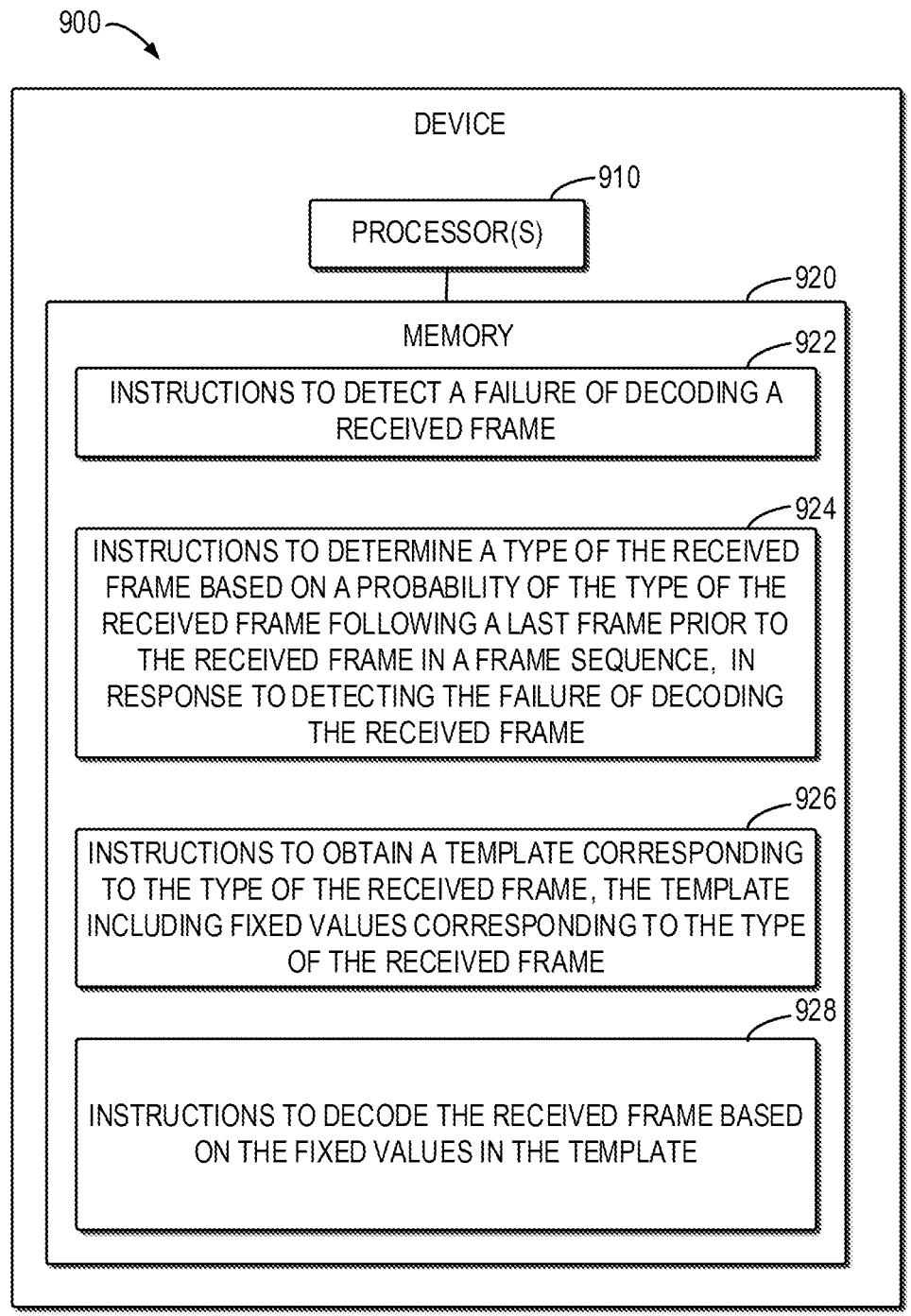
FIG. 9 illustrates a block diagram of an example device in accordance with some example implementations of the present disclosure.

FIG. 9 illustrates a block diagram of an example device 900 in accordance with some example implementations of the present disclosure. The device 900 comprises at least one processor 910 and a memory 920 coupled to the at least one processor 910. The memory 920 stores instructions to cause the at least one processor 910 to implement acts of the method according to implementations of the present disclosure.

As illustrated in FIG. 9, the memory 920 stores instructions 922 to detect a failure of decoding a received frame. The memory 920 further stores instructions 924 to determine type of the received frame based on a probability that the received frame follows a prior frame of the received frame in a frame sequence. The memory 920 further stores instructions 926 to obtain a template corresponding to the type of the received frame. In this case, the template including fixed values corresponding to the type of the received frame. The memory 920 further stores instructions 928 to decode the received frame based on the fixed values in the template.

In some implementations, the instructions to determine the type of the received frame comprise instructions to, determine a transmitted frame prior to the received frame in the frame sequence, and obtain a plurality of probabilities associated with the transmitted frame from a probability table. Wherein each term in the probability table indicates a probability that a first type of frame is followed by a second type of frame. The instructions to determine the type of the received frame further comprise instructions to select at least one probability greater than a predefined threshold from the plurality of probabilities, and determine at least one type of the received frame according to the selected at least one probability, wherein the at least one type comprises the type.

In some implementations, the memory 920 may further comprise instructions to obtain a plurality of frame sequences, determine a statistical probability for each term in the probability table based on the plurality of frame sequences, and generate a probability table based on the determined statistical probability.

In some implementations, the instructions to decode the received frame comprise instructions to, decode the received frame based on fixed values in at least one candidate template corresponding to the at least one type respectively to obtain at least one candidate decoded frame, determine at least one Bit Error Ratio (BER) for the at least one candidate decoded frame, and select a decoded frame with the lowest BER from the at least one candidate decoded frame.

In some implementations, the instructions to decode the received frame based on the fixed values in the at least one candidate template comprise the instructions to, obtain the fixed values in each of the at least one candidate template; encode the fixed values to obtain fixed code words corresponding to each of the at least one candidate template, update corresponding code words encoded for the received frame with the fixed code words corresponding to each of the at least one candidate template to obtain respective updated code words, and obtain at least one candidate decoded frame based on the respective updated code words.

In some implementations, the memory 920 may further comprises instructions to, determine a format corresponding to one type of frame where the format comprises at least one fixed field, determine values for the at least one fixed field in the format, and apply the values to the fixed fields to generate the template.

In some implementations, the instructions to determine values for the fixed fields in the format, if the device determines that the format comprises fields corresponding to fields in a known frame, the device may determine the fields in the format as the fixed fields. Then, the device determines values for the fixed fields in the format based on the corresponding fields in the known frame.

In some implementations, the instructions to detect the failure of decoding the received frame comprise instructions to, decode the received frame to obtain a decoded frame, determine a check value of the decoded frame by performing a check on the decoded frame corresponding to an attached check value of the received frame, and determine the failure of decoding the received frame if the check value deviates from an attached check value of the received frame.

The present disclosure also provides at least one computer program product tangibly stored on a non-transitory computer-readable storage medium. The computer program product includes program codes or instructions which can be executed to carry out the method as described above with reference to FIG. 8.

While the above discussion used a Wi-Fi communication standard as an illustrative example, in other implementations a wide variety of communication standards and, more generally, wireless communication technologies may be used. Furthermore, while some of the operations in the foregoing implementations were implemented in hardware or software, in general the operations in the preceding implementations can be implemented in a wide variety of configurations and architectures. Therefore, some or all of the operations in the foregoing implementations may be performed in hardware, in software or both.

It should be noted that specific terms disclosed in the present disclosure are proposed for convenience of description and better understanding of example implementations of the present disclosure, and the use of these specific terms may be changed to another format within the technical scope or spirit of the present disclosure.

Program codes or instructions for carrying out methods of the present disclosure may be written in any combination of one or more programming languages. These program codes or instructions may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code or instructions may execute entirely on a machine, partly on the machine, as a stand-alone software package, partly on the machine and partly on a remote machine or entirely on the remote machine or server.

In the context of this disclosure, a computer-readable medium may be any tangible medium that may contain, or store a program for use by or in connection with an instruction execution system, apparatus, or device. The computer-readable medium may be a computer-readable signal medium or a computer-readable storage medium. A computer-readable medium may include but not limited to an electronic, magnetic, optical, electromagnetic, infrared, or semiconductor system, apparatus, or device, or any suitable combination of the foregoing. More specific examples of the computer-readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Certain features that are described in the context of separate implementations may also be implemented in combination in a single implementation. Conversely, various features that are described in the context of a single implementation may also be implemented in multiple implementations separately or in any suitable sub-combination.

In the foregoing Detailed Description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

What is claimed is:

1. A method comprising:
   detecting a failure of decoding a received frame;
   in response to detecting the failure of decoding the received frame, determining a type of the received frame based on a probability that the received frame follows a prior frame of the received frame in a frame sequence;
   obtaining a template corresponding to the type of the received frame, the template including fixed values corresponding to the type of the received frame; and
   decoding the received frame based on the fixed values in the template.

2. The method of claim 1, wherein determining the type of the received frame comprises:
   determining a transmitted frame prior to the received frame in the frame sequence;
   obtaining a plurality of probabilities associated with the transmitted frame from a probability table, each term in the probability table indicating a probability that a first type of frame is followed by a second type of frame;
   selecting at least one probability greater than a predefined threshold from the plurality of probabilities; and
   determining at least one type of the received frame according to the selected at least one probability, the at least one type comprising the type.

3. The method of claim 2, further comprising:
   obtaining a plurality of frame sequences;
   determining a statistical probability for each term in the probability table based on the plurality of frame sequences; and
   generating the probability table based on the determined statistical probability.

4. The method of claim 2, wherein decoding the received frame comprises:
   decoding the received frame based on the fixed values in at least one candidate template corresponding to the at least one type respectively to obtain at least one candidate decoded frame;

determining at least one bit error ratio (BER) for the at least one candidate decoded frame; and selecting a decoded frame with the lowest BER from the at least one candidate decoded frame.

5. The method of claim 4, wherein decoding the received frame based on the fixed values comprises:

obtaining the fixed values in each of the at least one candidate template;

encoding the fixed values to obtain fixed code words corresponding to each of the at least one candidate template;

updating corresponding code words encoded for the received frame with the fixed code words corresponding to each of the at least one candidate template to obtain respective updated code words; and obtaining at least one candidate decoded frame based on the respective updated code words.

6. The method of claim 1, further comprising:

determining a format corresponding to one type of frame, the format comprising at least one fixed field;

determining values for the at least one fixed field in the format; and applying the values to the fixed fields to generate the template.

7. The method of claim 6, wherein determining values for the at least one fixed field in the format comprises:

in response to determining that the format comprises fields corresponding to fields in a known frame, determining the fields in the format as the fixed fields; and determining values for the fixed fields in the format based on the corresponding fields in the known frame.

8. The method of claim 1, wherein detecting the failure of decoding the received frame comprises:

decoding the received frame to obtain a decoded frame;

determining a check value of the decoded frame by performing a check on the decoded frame; and in response to determining that the check value deviates from an attached check value of the received frame, determining the failure of decoding the received frame.

9. A device comprising:

at least one processor; and a memory coupled to the at least one processor, the memory storing instructions to cause the at least one processor to implement acts comprising:

detecting a failure of decoding a received frame;

in response to detecting the failure of decoding the received frame, determining a type of the received frame based on a probability that the received frame follows a prior frame of the received frame in a frame sequence;

obtaining a template corresponding to the type of the received frame, the template including fixed values corresponding to the type of the received frame; and decoding the received frame based on the fixed values in the template.

10. The device of claim 9, wherein determining the type of the received frame comprises:

determining a transmitted frame prior to the received frame in the frame sequence;

obtaining a plurality of probabilities associated with the transmitted frame from a probability table, each term in the probability table indicating a probability that a first type of frame is followed by a second type of frame;

selecting at least one probability greater than a predefined threshold from the plurality of probabilities; and determining at least one type of the received frame according to the selected at least one probability, the at least one type comprising the type.

11. The device of claim 10, the acts further comprising:

obtaining a plurality of frame sequences;

determining a statistical probability for each term in the probability table based on the plurality of frame sequences; and generating the probability table based on the determined statistical probability.

12. The device of claim 10, wherein decoding the received frame comprises:

decoding the received frame based on the fixed values in at least one candidate template corresponding to the at least one type respectively to obtain at least one candidate decoded frame;

determining at least one bit error ratio (BER) for the at least one candidate decoded frame; and selecting a decoded frame with the lowest BER from the at least one candidate decoded frame.

13. The device of claim 12, wherein decoding the received frame based on the fixed values in the at least one candidate template comprises:

obtaining the fixed values in each of the at least one candidate template;

encoding the fixed values to obtain fixed code words corresponding to each of the at least one candidate template;

updating corresponding code words encoded for the received frame with the fixed code words corresponding to each of the at least one candidate template to obtain respective updated code words; and obtaining at least one candidate decoded frame based on the respective updated code words.

14. The device of claim 9, the acts further comprising:

determining a format corresponding to one type of frame, the format comprising at least one fixed field;

determining values for the at least one fixed field in the format; and applying the values to the fixed fields to generate the template.

15. The device of claim 14, wherein determining values for the at least one fixed field in the format comprises:

in response to determining that the format comprises fields corresponding to fields in a known frame, determining the fields in the format as the fixed fields; and determining values for the fixed fields in the format based on the corresponding fields in the known frame.

16. The device of claim 9, wherein detecting the failure of decoding the received frame comprises:

decoding the received frame to obtain a decoded frame;

determining a check value of the decoded frame by performing a check on the decoded frame; and in response to determining that the check value deviates from an attached check value of the received frame, determining the failure of decoding the received frame.

17. A non-transitory computer-readable medium comprising instructions stored thereon which, when executed by an apparatus, cause the apparatus to perform acts comprising:

detecting a failure of decoding a received frame;

in response to detecting the failure of decoding the received frame, determining a type of the received frame based on a probability that the received frame follows a prior frame of the received frame in a frame sequence;

obtaining a template corresponding to the type of the received frame, the template including fixed values corresponding to the type of the received frame; and decoding the received frame based on the fixed values in the template.

18. The non-transitory computer-readable medium of claim 17, wherein determining the type of the received frame comprises:

determining a transmitted frame prior to the received frame in the frame sequence;

obtaining a plurality of probabilities associated with the transmitted frame from a probability table, each term in the probability table indicating a probability that a first type of frame is followed by a second type of frame;

selecting at least one probability greater than a predefined threshold from the plurality of probabilities; and determining at least one type of the received frame according to the selected at least one probability, the at least one type comprising the type.

19. The non-transitory computer-readable medium of claim 18, the acts further comprising:

obtaining a plurality of frame sequences;

determining a statistical probability for each term in the probability table based on the plurality of frame sequences; and generating the probability table based on the determined statistical probability.

20. The non-transitory computer-readable medium of claim 18, wherein decoding the received frame comprises:

decoding the received frame based on the fixed values in at least one candidate template corresponding to the at least one type respectively to obtain at least one candidate decoded frame;

determining at least one bit error ratio (BER) for the at least one candidate decoded frame; and selecting a decoded frame with the lowest BER from the at least one candidate decoded frame.

* * * * *